United States Patent
Yu

(10) Patent No.: US 6,867,103 B1
(45) Date of Patent: Mar. 15, 2005

(54) METHOD OF FABRICATING AN ESD DEVICE ON SOI

(75) Inventor: Ta-Lee Yu, Hsin-chu (TW)

(73) Assignee: Taiwan Semiconductor Manufacturing Company, Hsinchu (TW)

( * ) Notice: Subject to any disclaimer, the term of this patent is extended or adjusted under 35 U.S.C. 154(b) by 0 days.

(21) Appl. No.: 10/154,740

(22) Filed: May 24, 2002

(51) Int. Cl.$^7$ .......................................... H01L 21/336
(52) U.S. Cl. .................. 438/289; 438/199; 438/200; 438/231; 438/250; 438/278; 438/304
(58) Field of Search ................. 438/199–220, 438/231–232, 241, 246, 247, 248, 249, 250, 276, 278, 289, 303, 302, 304, 305

(56) References Cited

U.S. PATENT DOCUMENTS

| | | | | |
|---|---|---|---|---|
| 5,571,738 A | * | 11/1996 | Krivokapic ............... | 438/291 |
| 5,759,901 A | * | 6/1998 | Loh et al. ................. | 438/305 |
| 5,773,348 A | * | 6/1998 | Wu ............................ | 438/305 |
| 5,976,921 A | * | 11/1999 | Maeda ...................... | 438/202 |
| 5,982,003 A | | 11/1999 | Hu et al. ................... | 257/347 |
| 6,034,397 A | * | 3/2000 | Voldman .................. | 257/335 |
| 6,034,399 A | | 3/2000 | Brady et al. .............. | 257/355 |
| 6,057,184 A | * | 5/2000 | Brown et al. ............. | 438/199 |
| 6,133,078 A | | 10/2000 | Yun ........................... | 438/200 |
| 6,137,141 A | * | 10/2000 | Son et al. .................. | 257/345 |
| 6,143,594 A | | 11/2000 | Tsao et al. ................. | 438/199 |
| 6,222,710 B1 | | 4/2001 | Yamaguchi ................ | 361/56 |
| 6,242,763 B1 | | 6/2001 | Chen et al. ................ | 257/107 |
| 6,297,082 B1 | * | 10/2001 | Lin et al. ................... | 438/217 |
| 6,355,962 B1 | * | 3/2002 | Liang et al. ............... | 257/369 |
| 6,383,876 B1 | * | 5/2002 | Son et al. .................. | 438/289 |
| 6,420,761 B1 | * | 7/2002 | Gauthier, Jr. et al. ..... | 257/360 |
| 6,429,482 B1 | * | 8/2002 | Culp et al. ................. | 257/345 |
| 6,452,236 B1 | * | 9/2002 | Nadakumar et al. ...... | 257/356 |
| 6,465,307 B1 | * | 10/2002 | Chidambaram et al. .. | 438/286 |
| 6,475,838 B1 | * | 11/2002 | Bryant et al. ............. | 438/153 |
| 6,482,703 B1 | * | 11/2002 | Yu ............................. | 438/281 |
| 6,514,839 B1 | * | 2/2003 | Ker et al. .................. | 438/154 |
| 6,642,581 B2 | * | 11/2003 | Matsuda et al. .......... | 257/369 |
| 2002/0028546 A1 | * | 3/2002 | Shin et al. ................. | 438/197 |
| 2002/0033511 A1 | * | 3/2002 | Babcock et al. .......... | 257/408 |
| 2002/0109187 A1 | * | 8/2002 | Matsumoto et al. ...... | 257/347 |
| 2002/0167050 A1 | * | 11/2002 | Brown et al. ............. | 257/347 |
| 2002/0185678 A1 | * | 12/2002 | Kim .......................... | 257/327 |
| 2003/0137789 A1 | * | 7/2003 | Walker et al. ............. | 361/56 |
| 2003/0235936 A1 | * | 12/2003 | Snyder et al. ............. | 438/92 |

* cited by examiner

*Primary Examiner*—Matthew Smith
*Assistant Examiner*—Renzo N Rocchegiani
(74) *Attorney, Agent, or Firm*—Thomas, Kayden, Horstemeyer & Risley

(57) ABSTRACT

A method to form transistors having improved ESD performance in the manufacture of an integrated circuit device is achieved. The method includes providing a SOI substrate with a doped silicon layer and a buried oxide layer. The doped silicon layer has a first conductivity type and overlies the buried oxide layer. Ions are implanted into the SOI substrate to form higher concentration regions in the doped silicon layer. The higher concentration regions have the first conductivity type and are formed substantially below the top surface of the doped silicon layer. MOS gates are formed. These MOS gates include an electrode layer overlying the doped silicon layer with a gate oxide layer therebetween. Source and drain regions are formed in the doped silicon layer to complete the transistors in the manufacture of the integrated circuit device. The source and drain regions contact the higher concentration regions and have a second conductivity type.

16 Claims, 9 Drawing Sheets

US 6,867,103 B1

METHOD OF FABRICATING AN ESD DEVICE ON SOI

BACKGROUND OF THE INVENTION (1) Field of the Invention

The invention relates to silicon-on-insulator (SOI) devices and, more particularly, to a method to form a SOI device having improved ESD performance.

(2) Description of the Prior Art

At present, the vast majority of integrated circuit products are formed on bulk semiconductor wafers. However, silicon-on-insulator (SOI) wafer-based products are under development as a majority technology for the future. SOI offers the advantages of improved short channel performance, improved isolation, and reduced power supply capability. However, ESD protection of SOI devices remains a significant challenge to manufacturers.

Referring now to FIG. 1, an example of a prior art SOI MOSEET is shown. The SOI substrate comprises a buried oxide layer 14, typically many microns thick, that is formed overlying a substrate 10. A silicon layer is formed overlying the buried oxide layer 14. In this case, the silicon layer has been doped to form an N+ source 26, an N+drain 22, and a P—body region 34 for a MOS transistor. A typical gate 30 is formed overlying the body region 34 between source 26 and drain 22. Shallow trench isolations (STI) 1B are formed through the silicon layer to the buried oxide layer 14 to isolate the MOS device.

The typical SOI NMOS transistor shown differs from a bulk version NMOS due to the presence of the buried oxide layer 14 underlying the MOS device. The buried oxide layer 14 provides excellent device isolation while facilitating the formation of MOS devices having improved short-channel capabilities. Note that the N+ drain 22 is coupled to an I/O pad for the integrated circuit device. Therefore, this transistor must be able to withstand ESD events due to external handling and/or external conditions. However, the presence of the buried oxide layer 14 may have detrimental effects for the ESD performance of the device.

During an ESD event, the drain 26 to body 34 junction will exhibit a reverse breakdown when the junction breakdown voltage is exceeded. Significant current will flow through the device. To prevent damage to the MOS device and to other parts of the overall integrated circuit, it is essential that the energy of the ESD pulse be dissipated. In a bulk MOS device, a part of this energy dissipation will occur in the bulk silicon material of the substrate. In the SOI, device, however, the buried oxide layer 14 blocks current flow into the bulk substrate 10. Further, the buried oxide layer 14 has a low thermal conductivity compared to silicon (about $\frac{1}{10}$ as large as silicon). Therefore, the buried oxide layer 14 tends to display excessive heating due to current flow. In addition, the absence of a bulk current path causes current concentration near the surface of the MOS channel where excessive energy dissipation can cause damage. Finally, the relative energy dissipation in the device is proportional to the reverse breakdown voltage of the N+ drain 22 to P—body 34 junction. It is found that the SOI MOSFET device displays a lower power-to-failure curve than a bulk-substrate MOSFET. A method of improving the ESD performance of the SOI MOS device would represent a significant step forward in the development of SOI as a majority technology.

Several prior art inventions relate to the ESD performance of SOI devices. U.S. Pat. No. 6,242,763 to Chen et al teaches a silicon-controlled rectifier (SCR) device for a SOI process. The SCR adds an N+/P+ zener diode to the prior SCR to reduce the trigger voltage. U.S. Pat. No. 6,222,710 to Yamaguchi discloses an ESD device in a SOI process where at least one MOS transistor is coupled to the external terminal by a forward bias. Another MOS transistor is also coupled to the terminal by reverse bias. U.S. Pat. No. 6,143,594 to Tsao et al describes a bulk silicon ESD protection scheme compatible with low voltage CMOS processing. U.S. Pat. No. 6,133,078 to Yun teaches a method to manufacture a bulk semiconductor device having an ESD protection region. Several impurity layers are implanted into the ESD region to improve ESD performance. U.S. Pat. No. 6,034,399 to Brady et al discloses an ESD device for use in a SOI system. The ESD device is formed in a bulk region to protect other devices formed in the SOI region. U.S. Pat. No. 5,982,003 to Hu et al teaches a SOI MOSFET having a low barrier body contact under the source region. An improvement in ESD performance of the device is cited.

SUMMARY OF THE INVENTION

A principal object of the present invention is to provide an effective and very manufacturable method for improving the ESD performance of an SOI transistor.

A further object of the present invention is to improve SOI MOSFET ESD performance by reducing the drain/body breakdown voltage.

Another further object of the present invention is to provide a SOI MOSFET having improved ESD performance.

Another further object of the present invention is to lower power dissipation in a SOI MOSFET during an ESD event.

Another further object of the present invention is to improve the uniformity of turn-on in an interleaved, or multi-fingered, device.

Another yet further object of the present invention is to provide improved ESD performance through an additional implantation to form a higher concentration region in the doped silicon layer of the SOI MOSFET.

In accordance with the objects of this invention, a method to form transistors having improved ESD performance in the manufacture of an integrated circuit device is achieved. The method comprises providing a SOI substrate comprising a doped silicon layer and a buried oxide layer. The doped silicon layer comprises a first type and overlies the buried oxide layer. Ions are implanted into the SOI substrate to form higher concentration regions in the doped silicon layer. The higher concentration regions comprise the first type and are formed substantially below the top surface of the doped silicon layer. MOS gates are formed. These MOS gates comprise an electrode layer overlying the doped silicon layer with a gate oxide layer therebetween. Source and drain regions are formed in the doped silicon layer to complete the transistors in the manufacture of the integrated circuit device. The source and drain regions contact the higher concentration regions and comprise a second type.

Also in accordance with the objects of this invention, a transistor device is achieved comprising a SOI substrate further comprising, first, a doped silicon layer and a buried oxide layer. The doped silicon layer comprises a first type and overlies the buried oxide layer. Second, a higher concentration region is formed in the doped silicon layer. The higher concentration region comprises the first type and is formed substantially below the top surface of the doped silicon layer. Third, a MOS gate comprising an electrode layer overlies the doped silicon layer with a gate oxide layer therebetween. Finally, source and drain regions are included in the doped silicon layer. The source and drain regions contact the higher concentration region and comprise a second type.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to form a SOI MOSFET device having improved ESD performance. A higher concentration region is formed in the body of the MOSFET to reduce the drain-to-body reverse breakdown voltage. The method is useful for either NMOS or PMOS devices. The method is especially useful to improve ESD current uniformity in interleaved, or multi-finger devices. It should be clear to those experienced in the art that the present invention can be applied and extended without deviating from the scope of the present invention.

Figure 1:
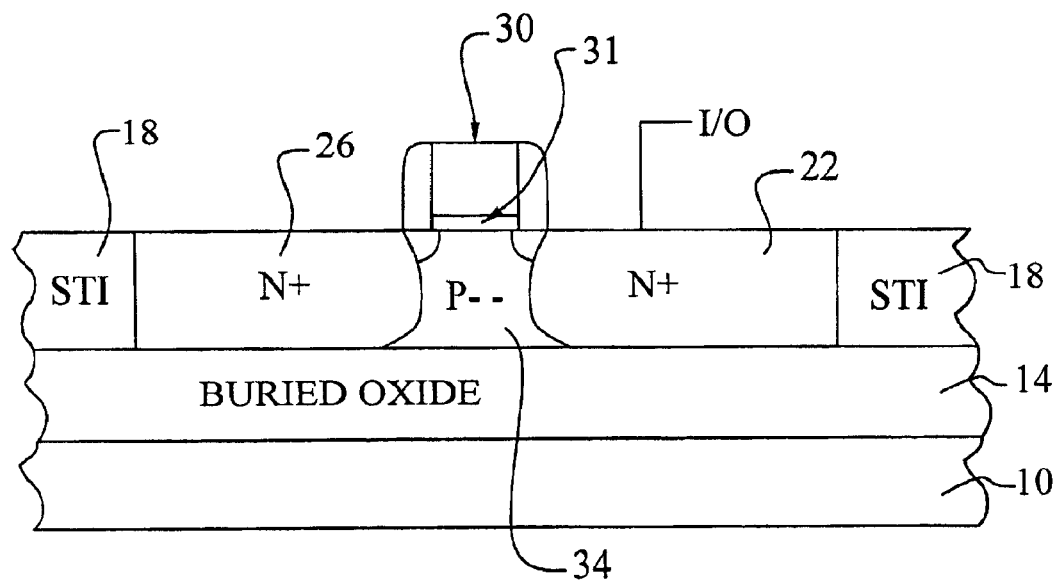
FIG. 1 illustrates a prior art example of a NMOS transistor formed in a SOI process.
Figure 2:
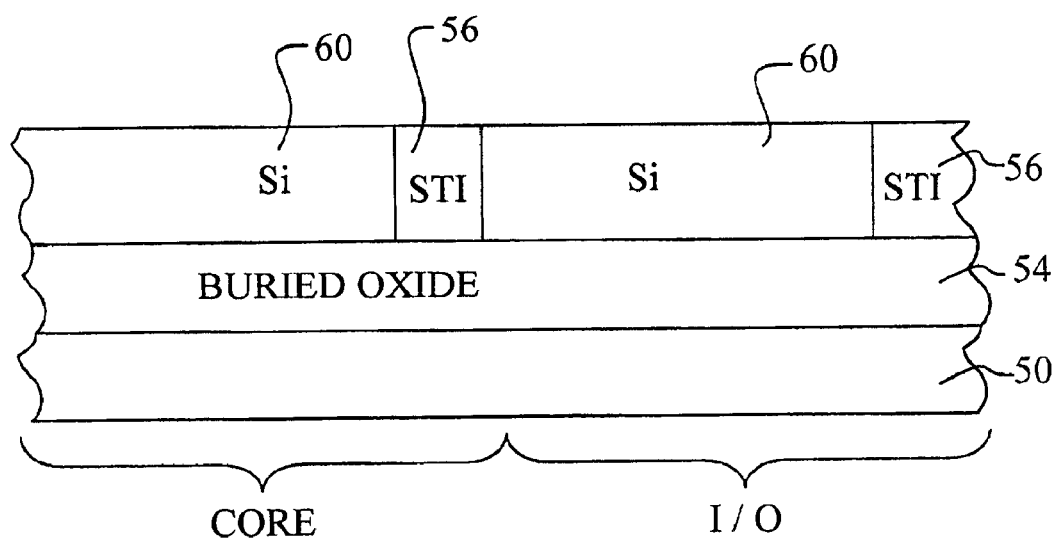
FIGS. 2 through 9 illustrate, in cross-sectional representation, the preferred embodiment method and device of the present invention.

Referring now to FIG. 2, the preferred starting point of the method the present invention is shown. The present invention applies to any SOI system. In this case, the SOI system, shown in cross-sectional representation, comprises a buried oxide layer 54 overlying a substrate 50. For example, the substrate 50 may comprise silicon. The buried oxide layer 54, in this case preferably comprises a thick silicon oxide layer that is either grown or deposited overlying the silicon substrate 54. Other oxide materials could be used for the buried oxide layer 54.

A silicon layer 60 is formed overlying the buried oxide layer 54. The silicon layer 60 preferably comprises a monocrystalline layer that is formed using, for example, an epitaxial deposition. The stack comprising silicon layer 60, buried oxide layer 54, and substrate 50 forms the silicon-on-insulator (SOI) system for this embodiment. Alternatively, the substrate 50 could be absent from the system wherein the substrate would comprise merely a buried oxide layer 54.

Shallow trench isolations (STI) 56 have been formed in the silicon layer 60 using methods well known in the art. These STI regions 56 define active area regions of silicon layer 60 where active devices may be subsequently formed. In this example, the active area on the left is defined for low voltage, or core, transistors. Meanwhile, the area on the right is defined for high voltage, or I/O, transistors. It is the I/O transistors that are the main subject of the present invention.

Figure 3:
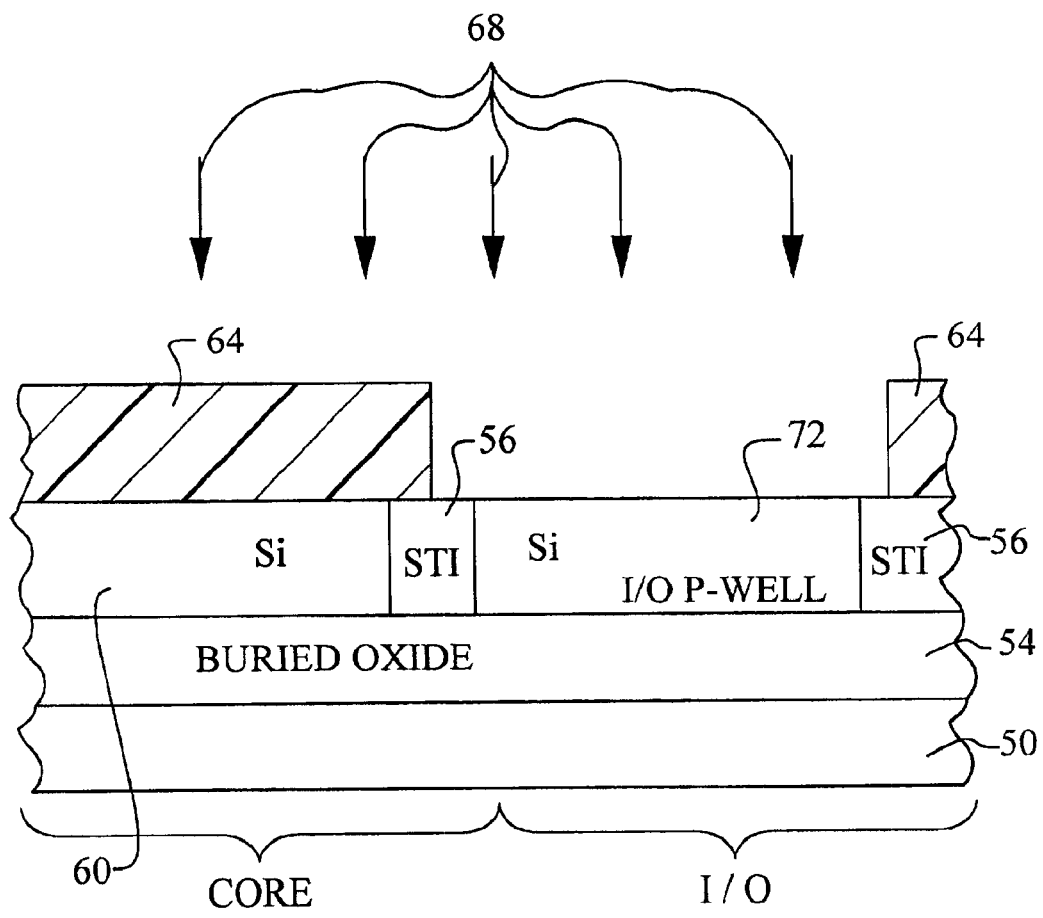

Referring now to FIG. 3, a feature of the present invention is shown. The method and device of the present invention will be illustrated and discussed assuming the formation of an ESD-enhanced, NMOS device in a P-Well. It should be clear to one skilled in the art that the method and device embodiments may be extended to the formation of an ESD-enhanced, PMOS device in an N-Well.

The active area silicon layer 60 in the I/O region is implanted with ions 68. The ion implantation 68 is used to cause the I/O region to become a P-Well region 72. Impurity ions, such as boron, are implanted into the silicon layer to cause the region to become a first type. In this case, the first type is p-type. In practice, this I/O P-Well 72 is a lightly doped region (P—) having a relatively high resistivity. As a generic embodiment, this I/O P-Well 72 is herein referenced as a doped silicon layer 72 of first type P. If a PMOS transistor is being formed, this doped silicon layer 72 would be an N-Well (N—) and the first type would be N.

Note that this I/O Well implantation 68 is blocked from the core region silicon layer 60 in this embodiment using a masking layer 64. By blocking the ion implantation 68, different MOS well, or body, concentrations can be used for the I/O and core devices.

Figure 4:
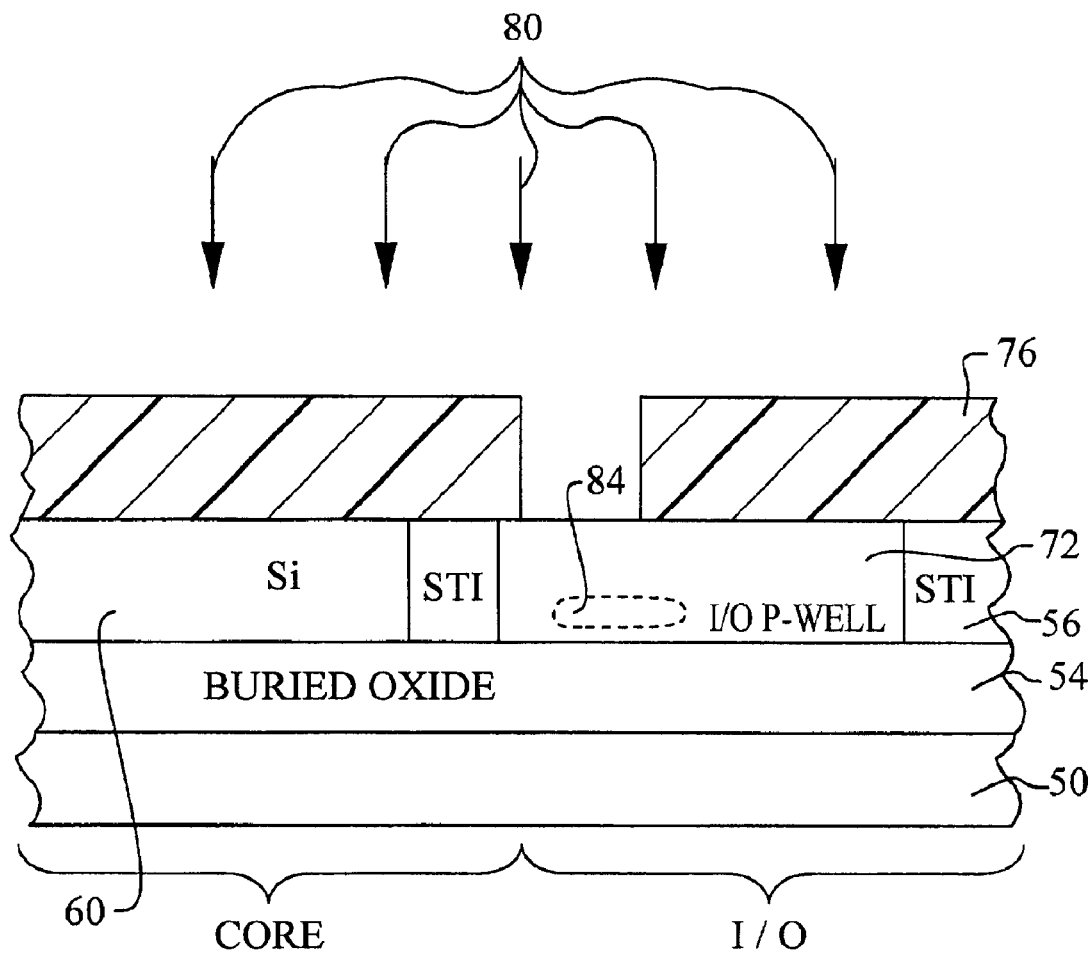

Referring now to FIG. 4, a most important feature of the present invention is illustrated. Ions are implanted 80 into the SOI substrate to form higher concentration regions 84 in the doped silicon layer 72. More specifically, the ion implantation 80 forms higher concentration (P–) regions 84 in the I/O P-Well 72. The higher concentration regions 84 comprise the same, first type (P) as the doped silicon layer 72 in which they are formed.

Further, the higher concentration regions 84 are formed substantially below the top surface of the doped silicon layer 72. The ion implantation 80 preferably comprises a dose of between about $1 \times 10^{13}$ ions/cm$^2$ and about $3 \times 10^{13}$ ions/cm$^2$ and an energy of between about 30 KeV and about 40 KeV.

Figure 11:
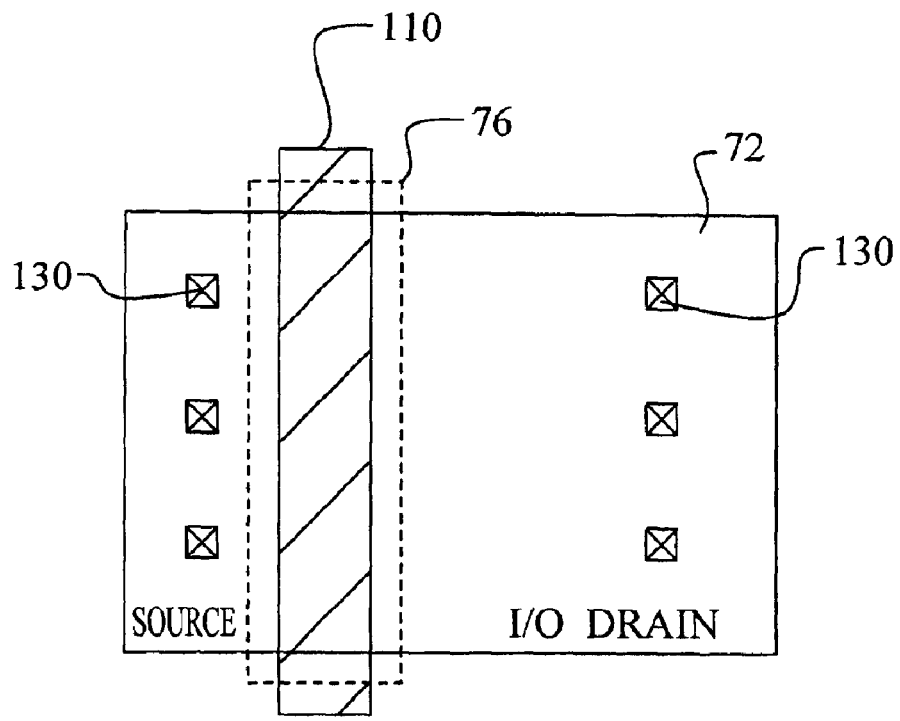
FIGS. 11 and 12 illustrate alternative layout arrangements for the device of the present invention.

Note that a masking layer 76 is used to prevent the ion implantation 80 of the core device region. In addition, the masking layer 76 may define the higher concentration region 84 in one of two ways. Referring now to FIG. 11 a top, layout view of the I/O ESD MOSFET device is shown. The doped silicon layer, or I/O P-Well layer 72 is shown. The area outside the I/O P-Well would correspond to STI regions. A gate layer 110 is shown intersecting the doped silicon layer 72. At this intersection, the gate region of the MOSFET will be formed. In this first technique, the high concentration region mask layer 76 is defined to overlap and completely cover the gate region of the MOSFET. However, only a part of the source and drain regions of the MOSFET will receive the ion implantation. Referring again to FIG. 4, the resulting higher concentration region 84 is formed underlying where the gate of the MOSFET will be formed.

Figure 10:
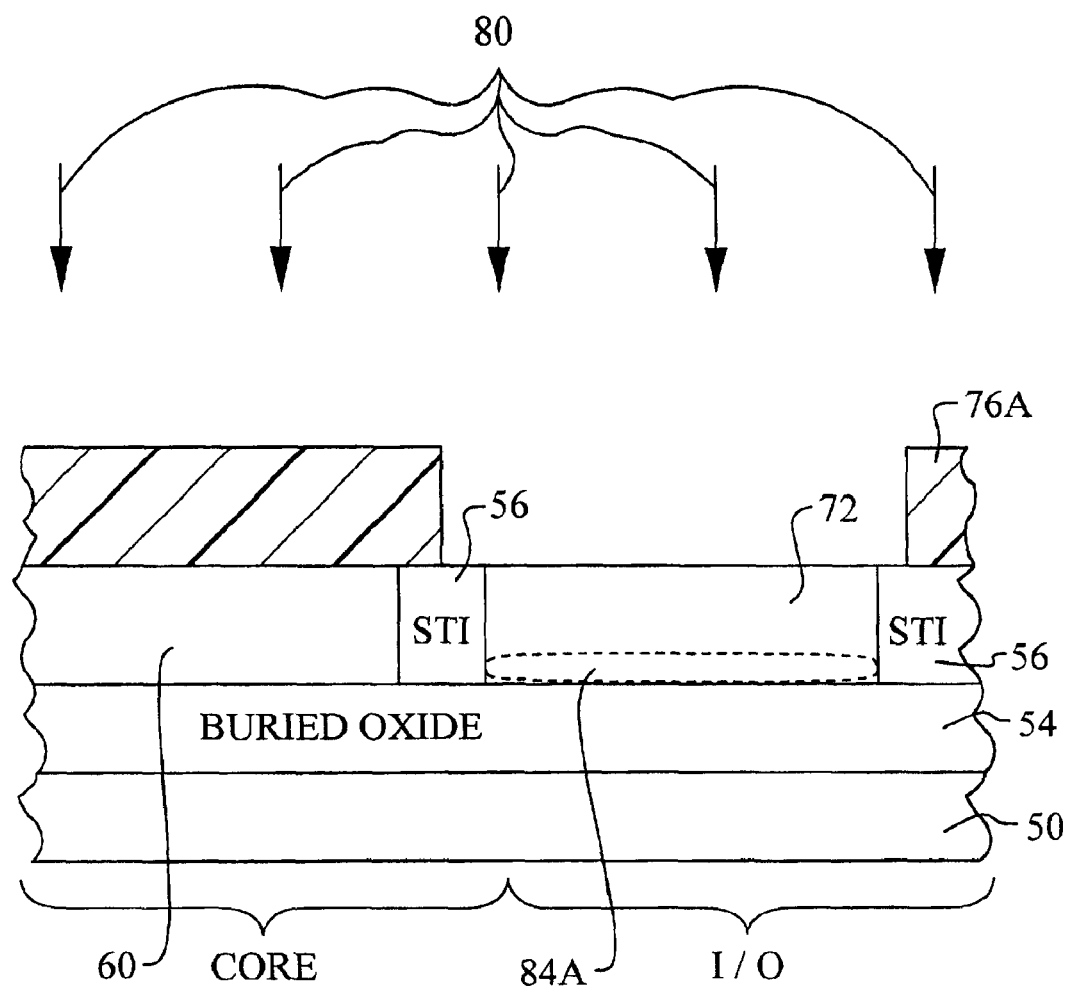
FIG. 10 illustrates, in cross-sectional representation, an alternative method of forming a higher concentration region in the present invention.
Figure 12:
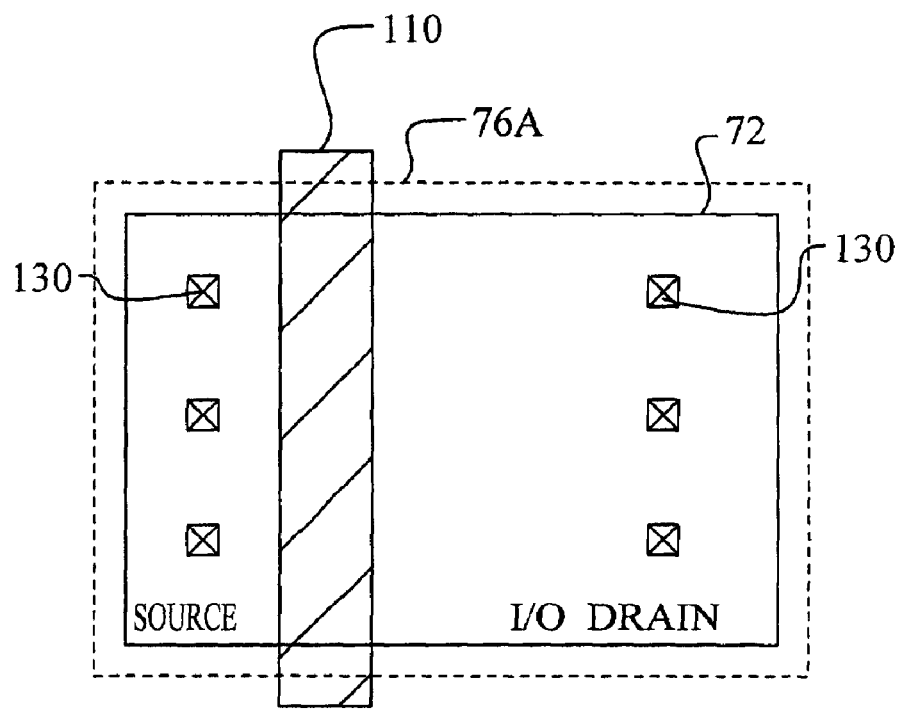

Referring now to FIG. 12, the second way of forming the higher concentration region is shown. In this layout view, the higher concentration region masking layer 76A is shown as exposing the entire doped silicon layer, or I/O P-Well layer 72. In this technique, the higher concentration layer will be formed throughout the entire I/O P-Well 72. Referring now to FIG. 10, the cross-section view shows the resulting higher concentration layer 84A of the second technique. In the remaining process steps, the smaller higher concentration layer 84, resulting from the first technique, will be shown. It will be understood by those skilled in the art, however, that either technique will work.

Figure 5:
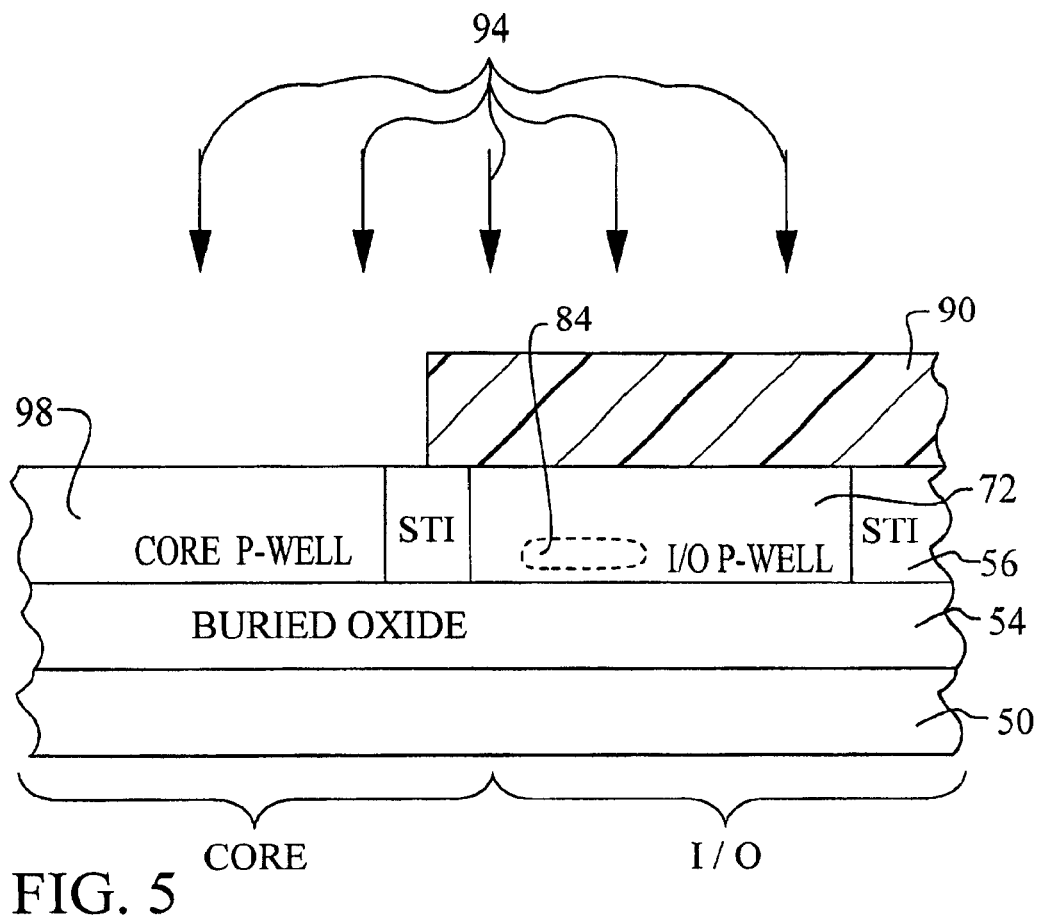

Referring now to FIG. 5, an important integration feature of the present invention is shown. To optimize the performance of the I/O devices and the core devices, it may be necessary to form the core and I/O P-Well regions 98 and 72 with different impurity concentrations. Generally, a lower concentration may be used on the I/O P-Well 72 to handle larger voltages. To facilitate different P-Wells, a separate core P-Well ion implantation 94 is performed to properly dope the core P-Well region 98. A masking layer 90 is preferably used to shield the I/O region from this implantation 94. It should be understood by those skilled in the art that the formation of two different P-Wells, core and I/O, is an optional feature of the present method.

Figure 6:
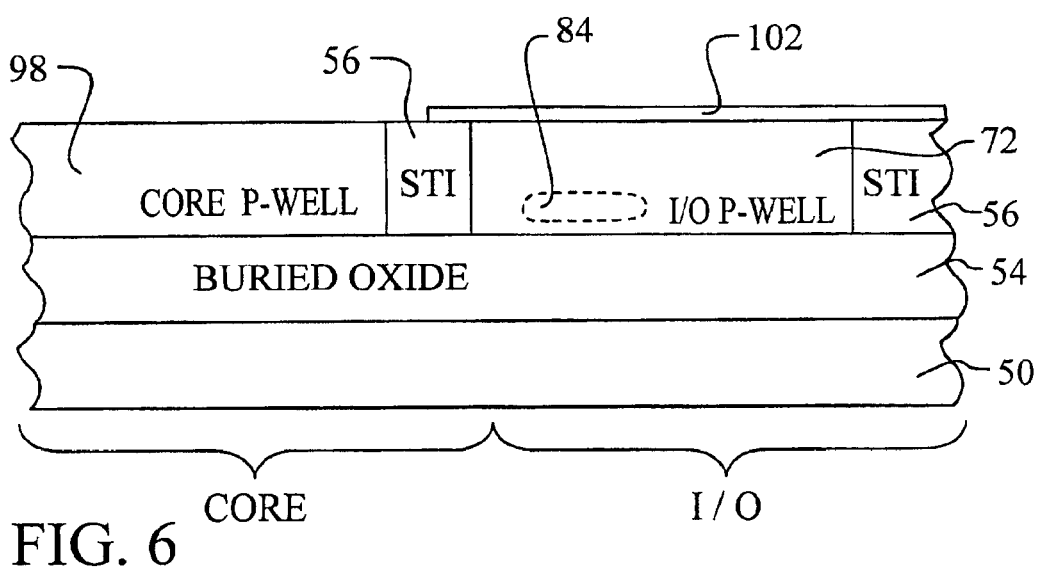

Referring now to FIG. 6, another optional feature of the present invention is shown. A first gate oxide layer 102 is formed overlying the SOI substrate. More particularly, this first gate oxide layer 102 is formed overlying the I/O doped silicon layer 72. To achieve this selective formation, the first gate oxide layer 102 is preferably formed, by thermal oxidation or by deposition, overlying the entire SOI wafer. The first gate oxide layer I/O is then selectively removed, by known methods, from the non-I/O areas.

Figure 7:
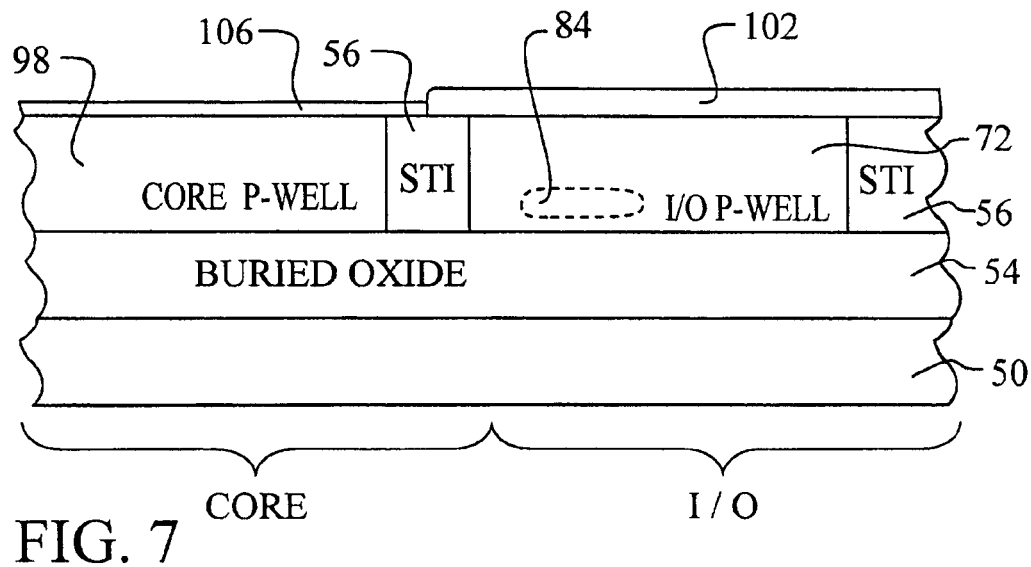

Referring now to FIG. 7, a second gate oxide layer 106 is formed overlying the SOI wafer. This additional gate oxide causes the first gate oxide layer 102 to be significantly thicker than the second gate oxide layer 106. As a result, the I/O region P-Well 72 has a thicker gate oxide than the core region P-Well 98. It should be understood that this is an optional feature of the present invention that is especially useful in forming I/O devices having substantially higher voltage capability than the core devices.

Figure 8:
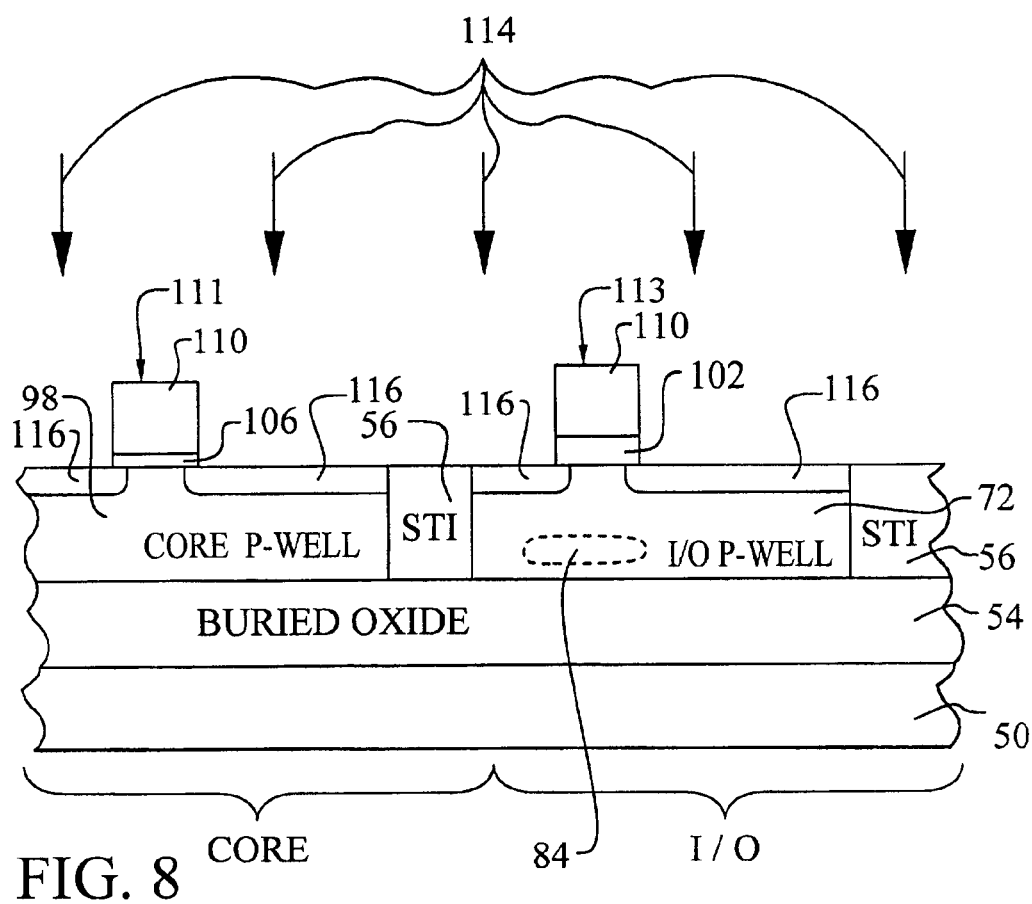

Referring now to FIG. 8, MOS gates 111 and 113 are simultaneously formed for the core and I/O devices. The core MOS gate 111 preferably comprises an electrode layer 110 overlying the core doped silicon layer 98 with the thinner gate oxide layer 106 therebetween. The I/O MOS gate 113 preferably comprises the electrode layer 110 overlying the I/O doped silicon layer 72 with the thicker gate oxide layer 102 therebetween. Alternative materials or methods may be used to form the core and I/O gates. The exact nature of the gates is not critical to the key features of the present invention.

An optional ion implantation 114 is performed to form lightly doped drain (LDD) regions 116 if this is part of the core device process. The LDD regions 116 comprise a second type of doping. In the case where the doped silicon layers 98 and 72 are P-Wells, the LDD regions 1116 are n-type. If the doped silicon layers 98 and 72 are N-Wells, the LDD regions 1116 are p-type.

Figure 9:
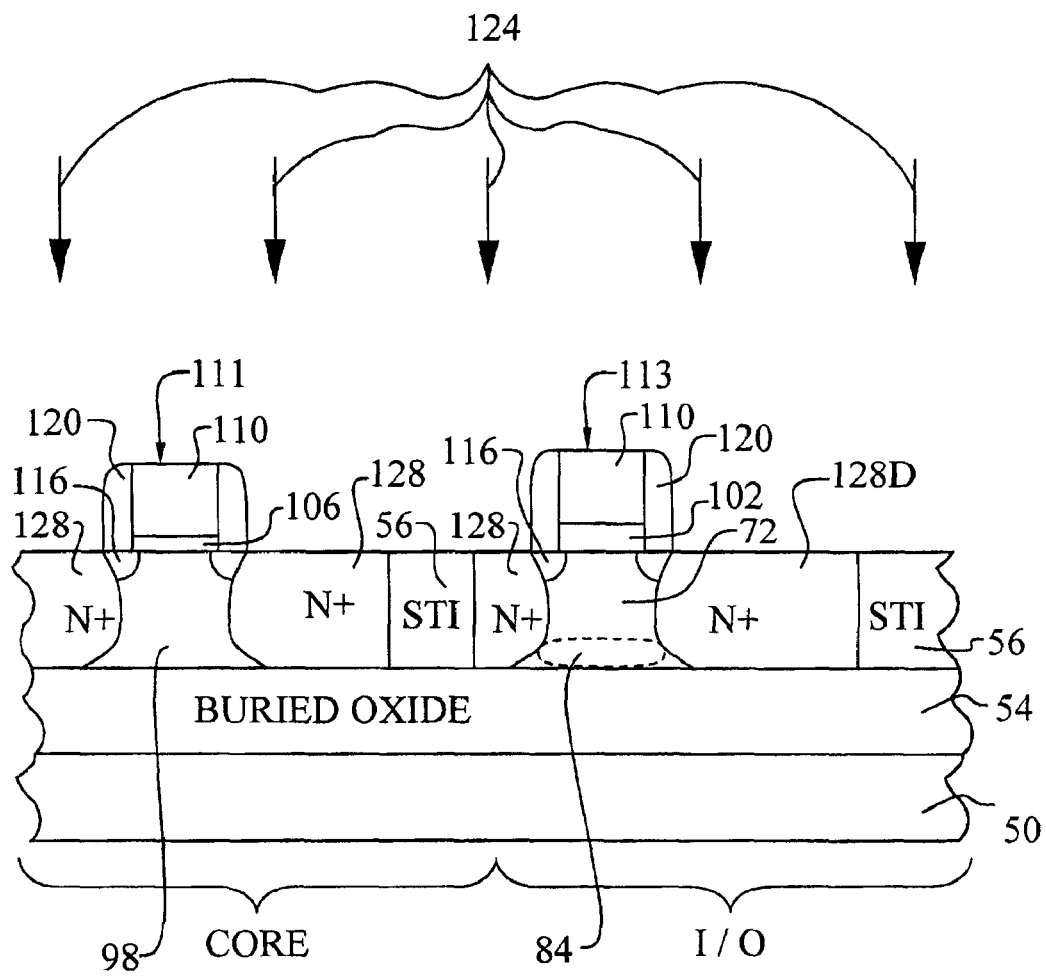

Referring now to FIG. 9, the completion of the devices is shown. If the core MOS process uses LDD regions 116 and sidewall spacers 120, then the sidewall spacers 120 are formed at this time. The sidewall spacers 120 preferably comprise a dielectric material that can be deposited and sputtered, by known processes, to form a layer only on the sidewalls of the gates 111 and 113.

The source and drain regions 128 and 128D are then formed in the doped silicon layers 98 and 72 to complete the transistors in the manufacture of the integrated circuit device. Preferably, an ion implantation 124 is performed to counter-dope the doped silicon layers 98 and 72 to the second type. If, for example, the doped silicon layers 98 and 72 are P-Wells, then the source and drain regions 128 and 128D are doped heavily n-type. If the doped silicon layers 98 and 72 are N-Wells, then the source and drain regions 128 and 128D are doped heavily p-type.

Most importantly, note that the source and drain regions of the I/O MOS device 128 and 128D contact the higher concentration region 84. This is an important feature to control the operation of the I/O MOS transistor during ESD events. The I/O transistor drain 128D is coupled to a node of the integrated circuit device that is exposed to an external voltage. If this node experiences an ESD spike, then the drain 128D will see a large, positive voltage with respect to the I/O P-Well 72. The presence of the higher concentration region 84 will lower the reverse breakdown voltage of the drain 128D to body 72 junction. This reduced breakdown voltage on the drain side 128D also results in a higher electric field across the drain-body junction.

Figure 13:
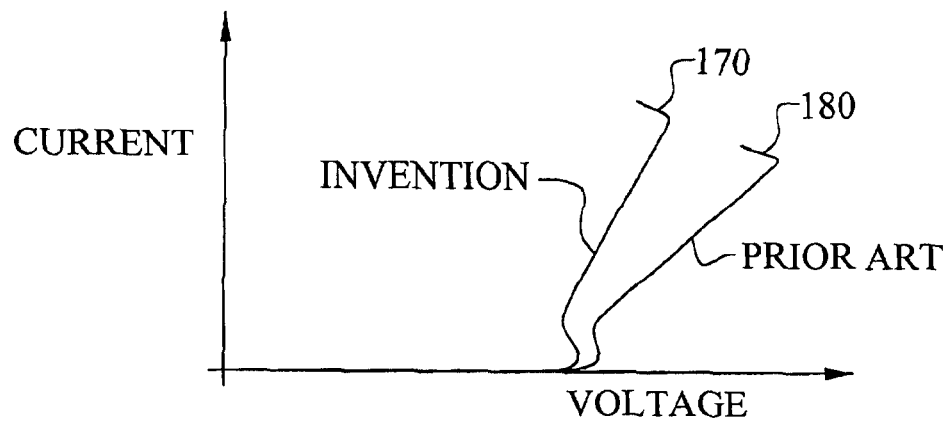
FIG. 13 illustrates the improved ESD performance of the device of the present invention.

There are several positive results from this reduced breakdown voltage effect. First, the current flow will occur at a lower voltage and results in reduced power dissipation during an ESD event. Second, since the breakdown occurs at the higher concentration region 84, the ESD current is shunted away from the channel surface. This increases the power-to-failure curve performance of the device. Referring now to FIG. 13, the power-to-failure curve for the prior art SOI device 180 and for the invention SOI device 170 are shown. The device of the present invention turns ON at a lower reverse voltage and dissipates less power while reaching a higher current before run-away breakdown. It is further found that the resulting MOS transistors exhibit a slight reduction in threshold voltage of about 50 mVolts and very low leakage currents.

Figure 14:
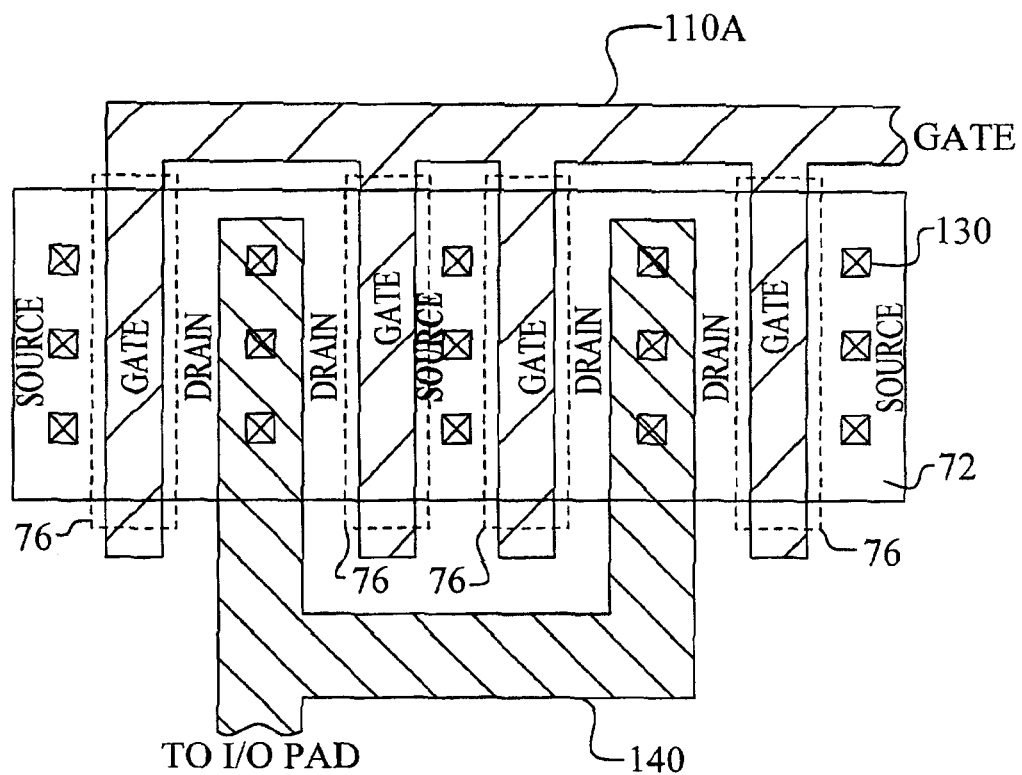
FIG. 14 illustrates the application of the present invention to an interleaved, or multi-fingered, I/O device.

Referring now to FIG. 14, an additional application and advantage of the present invention is shown. An interleaved, or multi-fingered, I/O MOS device is shown. In an interleaved device, alternating strips, or fingers, of source, gate, and drain are designed into the layout. This type of device layout is commonly used in the art to create large width devices. Here, the drain is coupled by the metal layer 140 to an I/O pad. The gate comprises the electrode layer 110A. As is typical in an ESD device, the contacts 130 for the drains are spaced a larger distance from the gate layer 110A than the contacts for the sources are to prevent spiking or shorting. As a most important feature, the higher concentration region mask 76 is designed to overlap the intersection of the gate layer 110A and I/O P-Well 72. The higher concentration region is thereby formed as in the previous examples. Alternatively, the higher concentration region mask 76 could be designed to overlie the entire I/O P-Well 72 as in the above-discussed second technique.

Interleaved devices can exhibit current crowding or non-uniform breakdown mechanisms. During an ESD event, a particular finger of the device may breakdown while other fingers do not breakdown. The snapback mechanism of the MOS ESD device will then cause the device to crowd current through a small section of the interleaved device and an early failure will occur. The advantage of having a large device area is thereby lost. However, the above-cited features of reduced, reverse breakdown voltage and of an alternative current path away from the channel region, cause the interleaved device of the present invention to exhibit excellent uniformity of breakdown and finger turn-ON.

Referring again to FIG. 9, the important features of the ESD MOSFET device of the present invention may now be summarized. The transistor device comprises, first, a SOI substrate further comprising, first, a doped silicon layer 72 and a buried oxide layer 54. The doped silicon layer 72 comprises a first type and overlies the buried oxide layer 54. Second, a higher concentration region 84 is formed in the doped silicon layer 72. The higher concentration region 84 also comprises the first type and is formed substantially below the top surface of the doped silicon layer 72. Third, a MOS gate 113 comprising an electrode layer 110 overlies the doped silicon layer 72 with a gate oxide layer 102 therebetween. Finally, source and drain regions 128 and 128D are included in the doped silicon layer 72. The source and drain regions 128 and 128D contact the higher concentration region 84 and comprise a second type.

The advantages of the present invention may now be summarized. An effective and very manufacturable method for improving the ESD performance of an SOI transistor is achieved. The ESD performance is improved through an additional implantation to from a higher concentration region in the doped silicon layer of the SOI MOSFET. The SOI MOSFET ESD performance is improved by reducing the drain/body breakdown voltage. Lower power dissipation in a SOI MOSFET during an ESD event is achieved. The uniformity of turn-ON in an interleaved, or multi-fingered, device is achieved.

As shown in the preferred embodiments, the novel method and device of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form transistors having improved ESD performance in the manufacture of an integrated circuit device comprising:
   providing a SOI substrate comprising a doped silicon layer and a buried oxide layer wherein said doped silicon layer comprises a first type and overlies said buried oxide layer;
   implanting ions into said SOI substrate to form higher concentration regions in said doped silicon layer wherein said higher concentration regions comprise said first type and are closer to the buried oxide layer than to the top surface of the doped silicon layer;
   forming MOS gates comprising an electrode layer overlying said doped silicon layer with a gate oxide layer therebetween wherein said higher concentration regions underlie and span the lateral length of said MOS gates; and
   forming source and drain regions in said doped silicon layer to complete said transistors in the manufacture of said integrated circuit device wherein said source and drain regions contact said higher concentration regions and comprise a second type.

2. The method according to claim 1 wherein said first type comprises p-type and said second type comprises n-type.

3. The method according to claim 1 wherein said step of ion implantation comprises a dose of between about $1 \times 10^{13}$ ions/cm$^2$ and about $3 \times 10^{13}$ ions/cm$^2$ and an energy of between about 30 KeV and about 40 KeV.

4. The method according to claim 1 wherein said higher concentration regions underlie all of each said source and drain region.

5. The method according to claim 1 wherein said higher concentration regions underlie only part of each said source and drain region.

6. The method according to claim 1 wherein said transistors comprise interleaved strips of said MOS gates, said source regions, and said drain regions.

7. The method according to claim 1 further comprising:
   forming lightly doped drain regions in said doped silicon layer after said step of forming said MOS gates; and
   forming spacers adjacent to said MOS gates prior to said step forming source and drain regions.

8. The method according to claim 1, wherein said high concentration regions adjoin the buried oxide layer.

9. A method to form I/O transistors having improved BSD performance in the manufacture of an integrated circuit device comprising:
   providing a SOI substrate comprising a doped silicon layer and a buried oxide layer wherein said doped silicon layer comprises a first type and overlies said buried oxide layer;
   implanting ions into said SOI substrate to form higher concentration regions in said doped silicon layer of I/O transistors wherein said higher concentration regions comprise said first type and are closer to the buried oxide layer than to the top surface of the doped silicon layer;
   simultaneously forming MOS gates for I/O transistors and core transistors comprising an electrode layer overlying said doped silicon layer with a gate oxide layer therebetween wherein said I/O transistors comprise a thicker gate oxide layer than that of said core transistors wherein said higher concentration regions underlie and span the lateral length of said MOS gates; and
   simultaneously forming source and drain regions for said I/O transistors and said core transistors in said doped silicon layer to complete said I/O transistors in the manufacture of said integrated circuit device wherein said source and drain regions contact said higher concentration regions and comprise a second type.

10. The method according to claim 9 wherein said first type comprises p-type and said second type comprises n-type.

11. The method according to claim 9 wherein said step of ion implantation comprises a dose of between about $1 \times 10^{13}$ ions/cm$^2$ and about $3 \times 10^{13}$ ions/cm$^2$ and an energy of between about 30 KeV and about 40 KeV.

12. The method according to claim 9 wherein said higher concentration regions underlie all of each said source and drain region of said I/O transistors.

13. The method according to claim 9 wherein said higher concentration regions underlie only part of each said source and drain region of said I/O transistors.

14. The method according to claim 9 wherein said I/O transistors comprise interleaved strips of said MOS gates, said source regions, and said drain regions.

15. The method according to claim 9 further comprising:
   forming lightly doped drain regions in said doped silicon layer after said step of forming said MOS dates; and
   forming spacers adjacent to said MOS gates prior to said step forming source and drain regions.

16. The method according to claim 9, wherein said high concentration regions adjoin the buried oxide layer.

* * * * *